(12) United States Patent
Feldman

(10) Patent No.: US 6,902,416 B2
(45) Date of Patent: Jun. 7, 2005

(54) HIGH DENSITY PROBE DEVICE

(75) Inventor: Steven Feldman, Cedar Park, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/230,849

(22) Filed: Aug. 29, 2002

(65) Prior Publication Data
US 2004/0043653 A1 Mar. 4, 2004

(51) Int. Cl.[7] ............................................. H01R 27/00
(52) U.S. Cl. ....................... 439/219; 439/482; 439/608; 439/752; 324/761
(58) Field of Search ......................... 439/219, 482–579, 439/701, 702, 101, 108, 608, 607, 752, 541.5; 324/754–761

(56) References Cited

U.S. PATENT DOCUMENTS

| | | | |
|---|---|---|---|
| 3,731,254 A | * | 5/1973 | Key ............................ 439/494 |
| 3,806,801 A | | 4/1974 | Bove |
| 3,852,700 A | * | 12/1974 | Haws ............................ 439/98 |
| 4,593,243 A | | 6/1986 | Lao et al. |
| 4,712,062 A | | 12/1987 | Takamine |
| 4,724,180 A | | 2/1988 | Kern |
| 4,734,046 A | * | 3/1988 | McAllister et al. .......... 439/101 |
| 4,827,211 A | | 5/1989 | Strid et al. |
| 4,931,726 A | | 6/1990 | Kasukabe et al. |
| 4,964,814 A | * | 10/1990 | Tengler et al. ............... 439/607 |
| 4,965,514 A | | 10/1990 | Herrick |
| 5,144,228 A | | 9/1992 | Sorna et al. |
| 5,190,472 A | * | 3/1993 | Voltz et al. .................. 439/579 |
| 5,194,020 A | * | 3/1993 | Voltz ........................... 439/579 |
| 5,308,250 A | | 5/1994 | Walz |
| 5,367,254 A | * | 11/1994 | Faure et al. ................. 324/761 |
| 5,416,429 A | | 5/1995 | McQuade et al. |
| 5,477,159 A | | 12/1995 | Hamling |
| 5,486,770 A | | 1/1996 | Johnson |
| 5,525,911 A | | 6/1996 | Marumo et al. |
| 5,625,299 A | | 4/1997 | Uhling et al. |
| 5,653,613 A | * | 8/1997 | Shimoda ...................... 439/752 |
| 5,654,647 A | | 8/1997 | Uhling et al. |
| 5,917,330 A | | 6/1999 | Miley |
| 5,952,839 A | | 9/1999 | Fredrickson |
| 6,160,412 A | | 12/2000 | Martel et al. |
| 6,196,866 B1 | | 3/2001 | Gaschke |
| 6,447,328 B1 | | 9/2002 | Feldman |
| 6,462,573 B1 | * | 10/2002 | McAllister et al. .......... 324/757 |
| 6,498,506 B1 | * | 12/2002 | Beckous ...................... 324/761 |
| 6,551,126 B1 | * | 4/2003 | Feldman ...................... 439/482 |

FOREIGN PATENT DOCUMENTS

| | | |
|---|---|---|
| EP | 0 177 809 B1 | 4/1992 |
| JP | 07218541 | 8/1995 |

* cited by examiner

Primary Examiner—Tho D. Ta
Assistant Examiner—X. Chung-Trans
(74) Attorney, Agent, or Firm—Melanie C. Gover

(57) ABSTRACT

A probe block assembly has an electrically insulative housing and an electrically conductive plate. The front side of the housing has a forward face and a recessed face. The electrically conductive plate is positioned against the recessed face of the housing. A plurality of probes extend from the forward face of the housing and are electrically isolated from each other and from the conductive plate. A plurality of probes extend from a front surface of the conductive plate and are in electrical contact with each other.

44 Claims, 5 Drawing Sheets

HIGH DENSITY PROBE DEVICE

THE FIELD OF THE INVENTION

The present invention relates to spring probe block assemblies of the type used in automatic test equipment (ATE), and specifically to spring probe block assemblies for use in high bandwidth applications.

BACKGROUND OF THE INVENTION

Spring probe blocks are used to provide temporary spring contact interfaces between integrated circuits or other electronic equipment and an automated test equipment test head. The automated test equipment performs necessary tests of the integrated circuits or other electronic equipment.

Spring probe block assemblies of the type used in automatic test equipment are widely available and use generally similar designs. Spring probe block housings are typically machined from metal bar stock in an elaborate and costly sequence of processes that assure precise locations and diameters of the bores that accept press-fitted electrical probes and ground receptacles. The solid metal fabrication also serves to commonly ground all of the circuit elements, which is a desirable feature in many applications. Where common grounding of the circuits is not required or desired, it is known that spring probe block housings may also be made of a molded polymer instead of a machined metal. A molded polymer housing provides a significant cost savings versus a machined metal housing. In addition, a housing formed of a conductive polymer material could be used in place of a metal housing to provide a common ground.

With both the metal and polymer probe block housings, coaxial probe connectors are individually terminated to coaxial cables at one end and to spring probes at the other. Typically, one spring probe is provided for each signal line, and one or more spring probes are provided to serve as a reference (i.e., ground) for each signal line. In the case of polymer spring probe housings, coaxial shield tubes and ground spring probes associated with each signal line can be electrically isolated from their neighbors by the dielectric material of the polymer housing. The electrical isolation of each channel (consisting of a signal line plus its associated ground return loop) may be used to achieve higher bandwidths to test faster integrated circuits and also to test integrated circuits more quickly. For example, in commonly assigned patent application Ser. No. 09/804,762, filed Mar. 12, 2001 and titled "High Bandwidth Probe Assembly", an insulative polymer housing electrically isolates each signal line and associated ground probe from other signal lines and ground probes.

In some instances, it is desired that a portion of the plurality of electrical probes in the housing be electrically isolated, while another portion of the plurality of electrical probes are commonly grounded. For example spring probes used to provide power must be isolated from other grounded probes. Currently, such a device is constructed by using a metal housing or ground plate to provide a common ground for the probes, and then isolating selected probes from the common ground using electrically insulative inserts or sleeves around the selected probes. Although generally effective, such a spring probe block construction is expensive and time consuming to produce. As noted above, the processes required to machine a metal housing is elaborate and costly. Further, the large number of small components (e.g., receptacles, insulator sleeves, etc.) used in such a device adds to the complexity and expense of manufacturing and assembling the device.

In addition to increasing the complexity of the device, the use of receptacles and insulators decreases the spring probe pointing accuracy by adding to the assembly stacking tolerances. Spring probe pointing accuracy is important along the Z-axis (the direction of spring probe movement) as well as along the lateral X and Y axes. Close control of Z axis assembly tolerances is necessary so that a device under test board can be brought very close to the probe block without contacting it. The smallest gap that can be safely achieved is desired to minimize the loop inductance which is proportional to the exposed probe length. Close control of X and Y axis assembly tolerances is necessary to ensure that the probes do in fact make contact with the intended areas of the device under test board. As devices become smaller, stacking tolerances have a greater importance in the pointing accuracy of the device.

Clearly, what is needed is a spring probe block assembly that can provide a cost effective approach for providing both electrically commoned and electrically isolated probes in the probe block. Preferably, such a spring probe block assembly would reduce the number of components used in the completed assembly. Preferably, the spring probe block assembly would also facilitate the replacement of spring probes and coaxial connectors within the probe block assembly without requiring extensive rework or even scrapping of the entire spring probe block assembly. In addition, the spring probe block assembly would preferably be resistant to high cable pullout forces that could inadvertently dislodge the coaxial connectors during motion of the automated test equipment.

SUMMARY OF THE INVENTION

The present invention is a spring probe block assembly for use with automated test equipment. The assembly described and claimed herein provides a cost effective approach for providing both electrically commoned and electrically isolated probes in the probe block assembly. The a spring probe block reduces the number of components used in the completed assembly, and facilitates the replacement of spring probes and coaxial connectors within the probe block assembly without requiring extensive rework or even scrapping of the entire assembly. In addition, the spring probe block assembly is resistant to high cable pullout forces that could inadvertently dislodge probes or connectors during motion of the automated test equipment.

In one embodiment according to the invention, the probe block assembly comprises an electrically insulative housing and an electrically conductive plate. The housing has a front side including a forward face and a recessed face. The electrically conductive plate is positioned against the recessed face of the front side of the housing. A plurality of probes extend from the forward face of the housing and are electrically isolated from each other and from the conductive plate. A plurality of probes extend from a front surface of the conductive plate and are in electrical contact with each other.

In another embodiment according to the invention, the probe block assembly comprises an electrically insulative housing and an electrically conductive plate. The housing has a front side including a forward face and a recessed face. The electrically conductive plate is positioned against the recessed face of the front side of the housing. At least one probe extends through the conductive plate and into the housing, such that the at least one probe is elastically deflected by the housing and urges the conductive plate against the housing.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
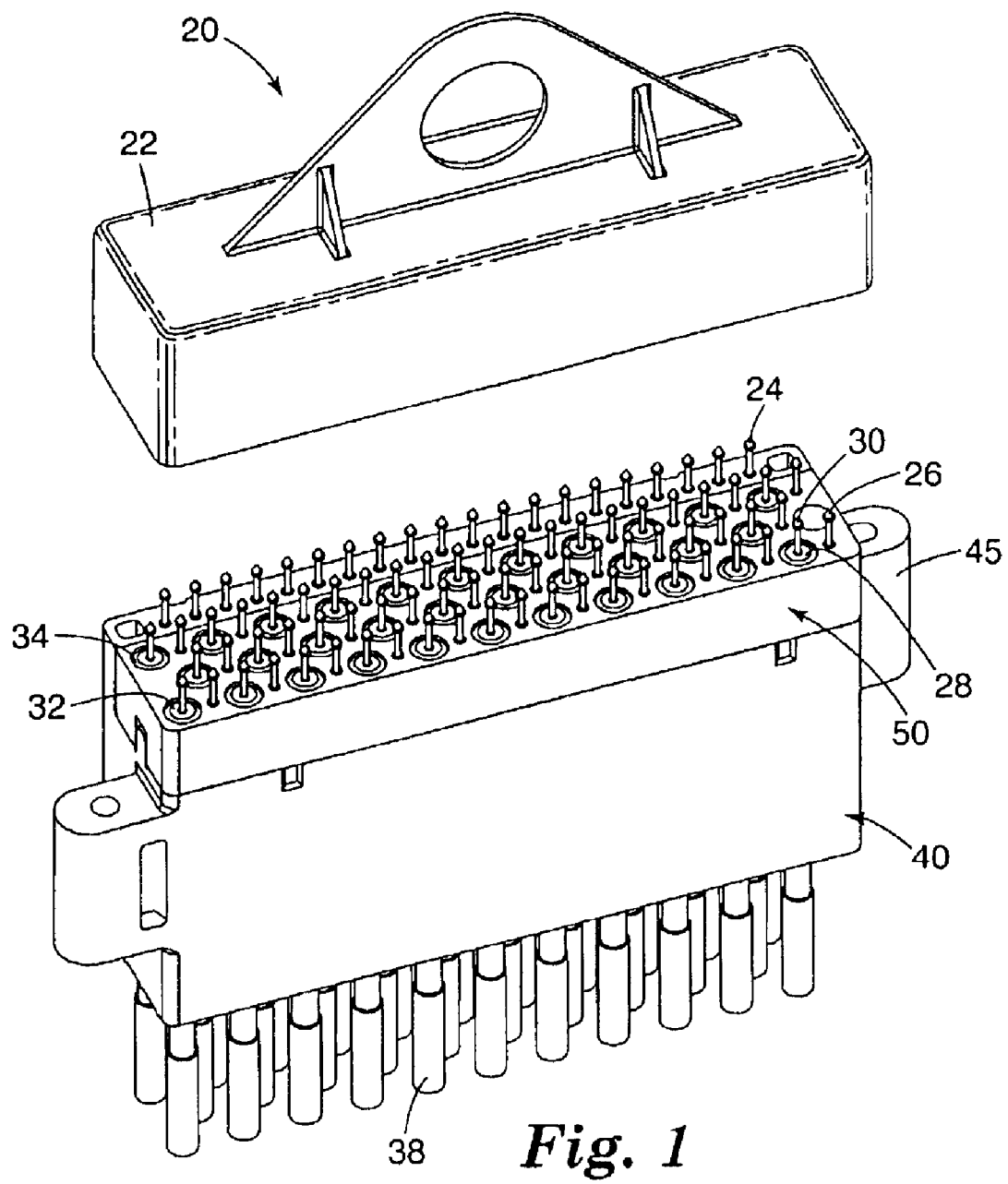
FIG. 1 is a perspective view of on embodiment of a spring probe block assembly according to the invention.
Figure 2:
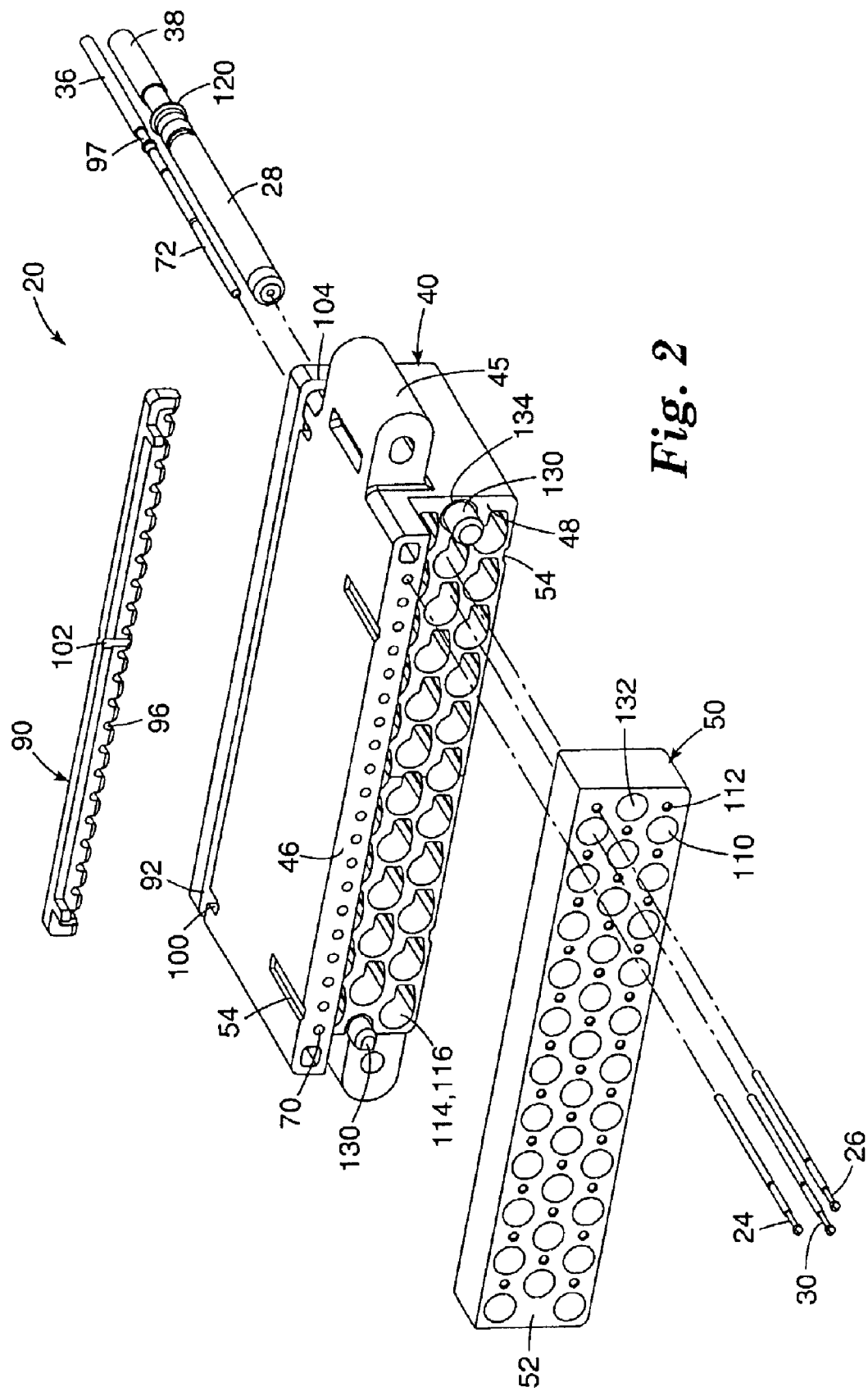
FIG. 2 is an exploded view of the spring probe block assembly of FIG. 1.

FIG. 1 provides a perspective view of one embodiment of a spring probe block assembly 20 with a shipping/service cover 22 according to the invention, while FIG. 2 provides an exploded perspective view of the assembly of FIG. 1. As discussed in greater detail below, spring probe block assembly 20 contains a plurality of spring probes, including power or utility spring probes 24, ground spring probes 26, and coaxial signal probe connectors 28. Signal probe connectors 28 are known in the art, and include a signal spring probe 30 surrounded by dielectric insulation 32 and then a conductive shield tube 34. The signal spring probe 30 is thus isolated from ground. Power or utility probes 24 are electrically connected to utility wires 36, while ground probes 26 and coaxial signal probe connectors 28 are electrically connected to coaxial cables 38. Utility wires 36 and coaxial cables 38 are connected to their respective probes in conventional manners such as soldering or crimping.

As seen in FIGS. 1 and 2, spring probe block assembly 20 includes a housing 40 which is formed from an insulative polymer material. Housing 40 may be formed by methods such as injection molding, machining, or stereolithography (SLA). The material used to form housing 40 may include, for example glass fiber reinforced polyphtalamide (PPA), mineral filled liquid crystal polymer (LCP), polyamide-imide (PAI), or other materials known in the art to provide suitable properties. As will become apparent below, use of a polymer material which is deformable without cracking or shattering in thin sections is desirable in the implementation of several features of housing 40. In some intended applications of the probe block assembly, it may be preferred to use polymer materials that have anti-static or static-dissipating properties, such as carbon fiber reinforced polyphtalamide or carbon filled polyamide (PA).

Insulative housing 40 includes a front side 42 and a back side 44. Mounting tabs 45 are positioned at lateral sides of housing 40, and are provided for securing assembly 20 to the automated test equipment. Various configurations of mounting tabs 45 may be provided, depending upon the intended final application of assembly 20 and on the configuration of the automated test equipment. Front side 42 includes a forward face 46 and a recessed face 48. An electrically conductive retainer plate 50 is positioned against recessed face 48, such that a front surface 52 of conductive plate 50 is coplanar with forward face 46 of housing 40. Together, forward face 46 of housing 40 and front surface 52 of conductive plate 50 form an interface end 60 of spring probe block assembly 20. In one embodiment according to the invention, front surface 52 of conductive plate 50 and forward face 46 of housing 40 are immediately adjacent each other, such that interface end 60 is a continuous and substantially flat surface. Conductive retainer plate 50 may be formed of any suitably conductive material such as a metal, a conductive polymer, or a metal plated polymer.

Interface end 60 thus includes an insulative portion (consisting of forward face 46 of housing 40) and a conductive portion (consisting of front surface 52 of conductive plate 50). As described in greater detail below, the insulative portion electrically isolates power or utility spring probes 24 from each other and from conductive plate 50, and also eliminates the need for discrete electrical insulators surrounding power or utility spring probes 24. The conductive portion electrically commons all ground probes 26 and the shield tubes 34 of the coaxial probe connectors 28.

Cover 22 is removably secured to assembly 20 by small retention teeth (not shown) on the interior surface of cover 22. The retention teeth engage locking channels 54 in housing 40. Cover 22 is thinly formed so as to permit close spacing of multiple assemblies 20, such as during assembly of the automated test equipment.

Figure 3:
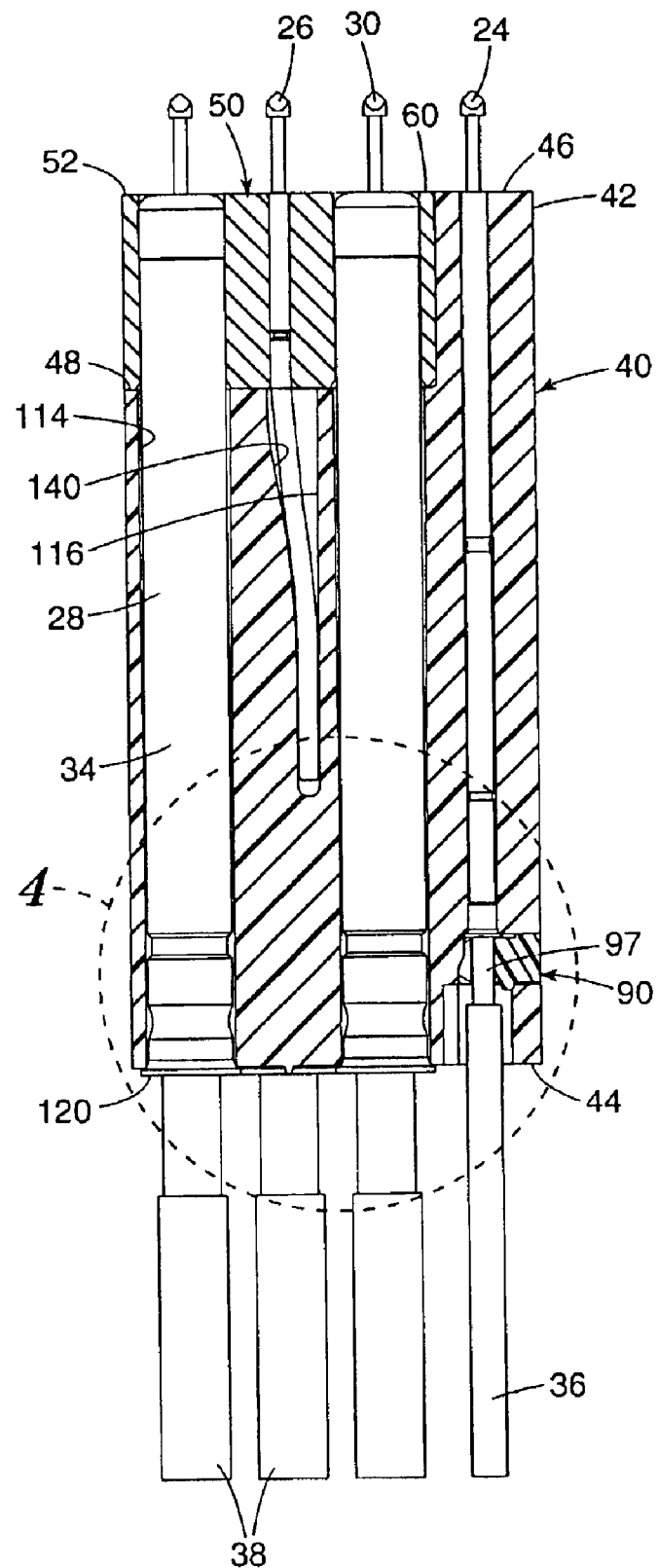
FIG. 3 is a cross sectional view of the spring probe block assembly of FIG. 1.
Figure 4:
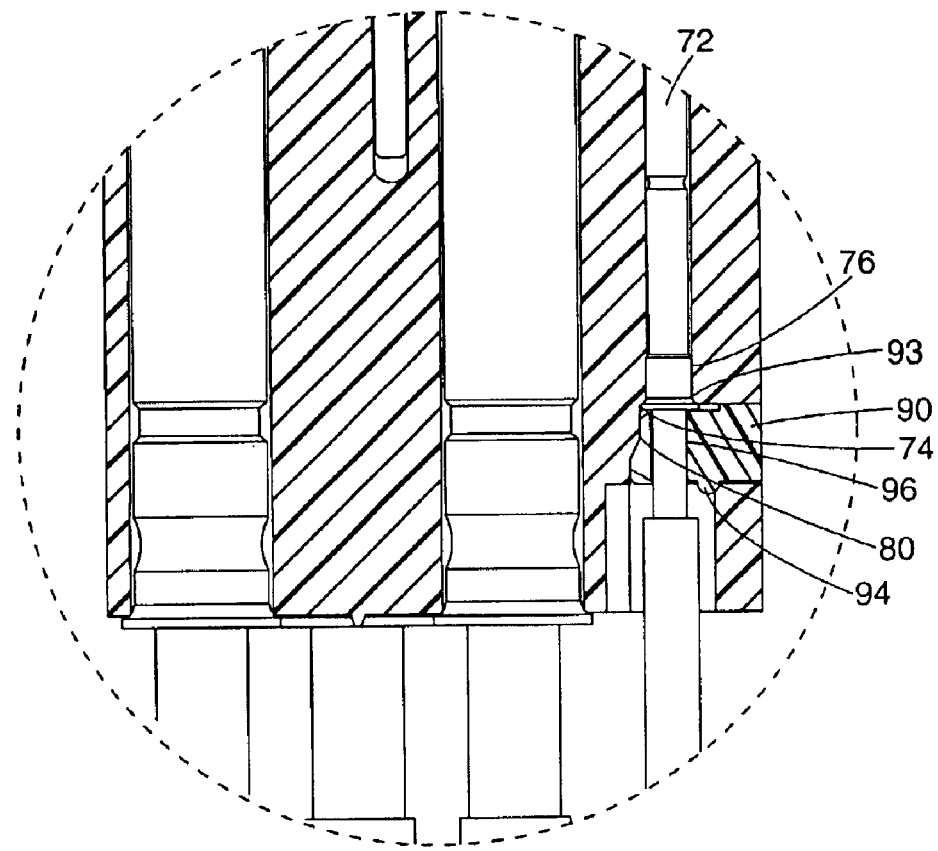
FIG. 4 is a greatly enlarged view of circled portion 4 of FIG. 3, illustrating several features of the spring probe block assembly.

As illustrated in FIGS. 2–4, to electrically isolate power or utility spring probes 24 from each other and from conductive plate 50, housing 40 includes a bore 70 extending from forward face 40 through housing 40 to back side 44 for each power or utility spring probe 24. Bores 70 are appropriately sized to receive probe receptacles 72. Probe receptacles 72 receive and removably retain power or utility spring probes 24 in the assembly and electrically connect them to their respective wires. Probe receptacles 72 are suitably terminated to utility wires by soldering, crimping, welding or other means known in the art. Because probe receptacles 72 and power or utility spring probes 24 are retained in the insulative material of housing 40, an additional insulative sleeve is not required. Thus, the tolerance of an insulative sleeve is removed from the tolerance stack and the pointing accuracy of the device improved.

In one embodiment according to the invention and as best seen in FIG. 4, power and utility probe receptacles 72 are provided with features that facilitate assembly and replacement within the spring probe block assembly 20, and which provide resistance to cable pullout forces that could inadvertently dislodge them during motion of the automated test equipment. In particular, each probe receptacle 72 includes a flange 74 at back end 76 of the receptacle 72. During assembly, each probe receptacle 72 (with utility wire 36 already attached) is inserted into its respective bore 70 from back side 44 of housing 40. The portion of bore 70 between back side 44 of housing 40 and longitudinal recess 92 must be enlarged to accept the diameter of flange 74 and attached utility wire 36. As probe receptacle 72 is inserted into bore 70, flange 74 rides up ramp 80 in bore 70 such that probe receptacle 72 is lightly retained by friction in its respective bore 70. Once lightly retained in this manner, a plurality of probe receptacles 72 and their associated utility wires 36 may be securely held in place by receptacle retainer 90 without a need for special fixturing to hold probe receptacles 72 and associated utility wires 36 in place while receptacle retainer 90 is installed.

Receptacle retainer 90 resides in longitudinal recess 92 near back side 44 of housing 40. Recess 92 extends across the width of housing 40, and is positioned immediately behind probe receptacles 72 after they are inserted into housing 40 as described above. Receptacle retainer 90 is press fit into recess 92, such that receptacle retainer 90 bears firmly against flanges 74 of probe receptacles 72 and drives the flanges 74 securely into shoulders 93 of housing 40, where bores 70 intersect recess 92. Receptacle retainer 90 may further include small protrusions or bumps 94 that engage housing 40 and securely maintain receptacle retainer 90 within recess 92. Preferably, receptacle retainer 90 is sized such that there is no play or movement between housing 40, probe receptacles 72 and receptacle retainer 90 when assembled together, even to the extent that flanges 74, shoulders 93, or bumps 94 may be slightly deformed when receptacle retainer 90 is completely installed in recess 92.

To ensure that receptacle retainer 90 positively engage a significant portion of each flange 74, receptacle retainer 90 is provided with a series of arch-shaped shoulders 96 which are sized and positioned to fit around the utility wires 36 attached to probe receptacles 72 (seen in cross-section in FIG. 4). In particular, utility wires 36 will include a stripped section 97 immediately behind flanges 74 that results from the process of connecting utility wires 36 to probe receptacles 72. Arch shaped shoulders 96 are thus preferably sized to closely fit around the striped wire section 97 and to have a radius which is smaller than both flange 74 of probe receptacles 72 and the insulation over utility wires 36.

To establish the proper installation position and orientation of receptacle retainer 90, an alignment key 98 which engages a groove 100 in housing 40 is provided. Alignment key 98 is positioned in groove 100 and receptacle retainer 90 is simply rotated into recess 92 without stubbing against probe receptacles 72 or utility wires 36. More than one alignment key 98 (e.g., one at each end of receptacle retainer 90) may be provided. The presence of an alignment key 98 at each end of receptacle retainer 90 simplifies assembly by allowing installation of retainer 90 from either side. It also permits receptacle retainer 90 to be molded as a frangible unit (such as by the presence of notch 102) and both halves of retainer 90 to be used in smaller assemblies. To ease removal of receptacle retainer 90 from recess 92 (such as when replacing probe receptacles 72), a pry slot 104 may optionally be provided in housing 40 adjacent receptacle retainer 90. A tool or fingernail may then be used to lift receptacle retainer 90 from recess 92 and thereby allow probe receptacles to be removed from housing 40.

In an alternate embodiment according to the invention, probe receptacles 72 may be eliminated and power or utility spring probes 24 may be received directly into bores 70. In such an alternate embodiment, the length of power or utility probes 24 may need to be increased to reach through housing 40 to groove 100, and probes 24 would need to be provided with a shape similar to flange 74 of probe receptacles 72.

As noted above, conductive plate 50 is provided to electrically common all ground probes 26 and the shield tubes 34 of the coaxial probe connectors 28. Conductive plate 50 includes a plurality of bores extending from front surface 52 through conductive plate 50 to the recessed face 48 of housing 40. Each bore is sized to receive either a coaxial probe connector 28 (bores 110) or a ground probe 26 (bores 112). Bores 110 are sized to receive a coaxial probe connector 28 in a press fit manner such that the coaxial probe connector 28 is held securely within its respective bore 110. In contrast, bores 112 are sized to receive a ground probe 26 in a slip fit manner.

As best seen in FIG. 3, bores 110, 112 in conductive plate 50 are in turn each aligned with a corresponding bore in housing 40. Bores 110 which receive a coaxial probe connector 28 in conductive plate 50 are aligned with respective bores 114 in housing 40. Bores 114 extend from recessed face 48 to back side 44 of housing 40, and are sized to receive coaxial probe connectors 28 in a slip fit manner. Coaxial probe connectors 28 include flanges 120 which are larger than bores 114 in housing 40. Thus coaxial probe connectors 28 (with associated coaxial cables 38 attached) are inserted into bores 114 from back side 44 of housing 40 until insertion is stopped by flanges 120. As coaxial probe connector 28 passes into bore 110 of conductive plate 50, it is held securely by press fit in bore 110.

Figure 5:
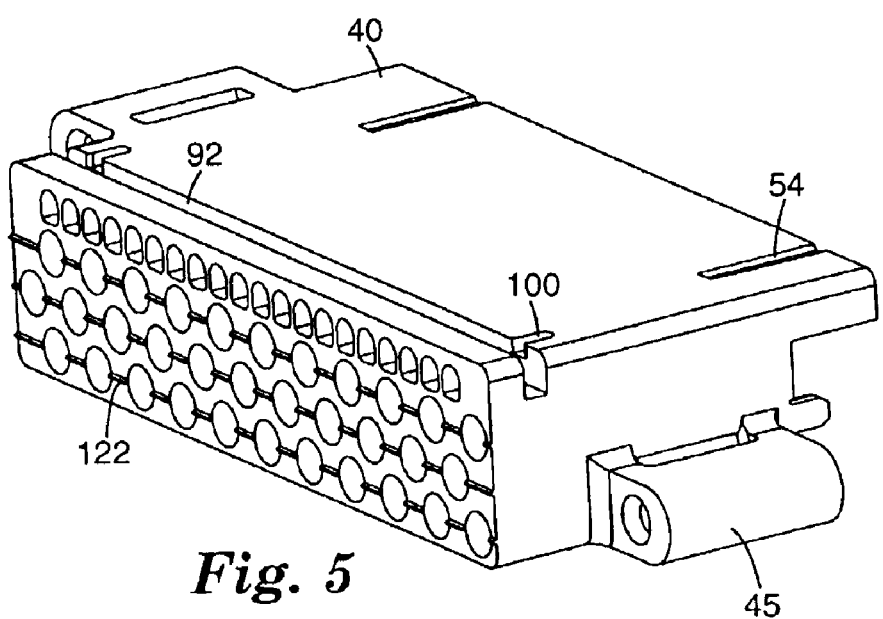
FIG. 5 is a perspective view of the back side the housing of the spring probe block assembly of FIG. 1.

To maintain spring probe pointing accuracy along the Z-axis (in the direction of spring probe movement) each coaxial probe connector 28 is seated in its respective bore 110 such that the conductive shield tube 34 is flush with front surface 52 of conductive plate 50. Any stacking and assembly tolerances of housing 40, conductive plate 50, and coaxial probe connector 28 are taken up by ribs 122 integrally molded into back side 44 of housing 40 (best seen in FIG. 5). As coaxial probe connector 28 is fully seated into housing 40 and conductive plate 50, ribs 122 are deformed by flanges 120 so there is no gap between flanges 120 and ribs 122. Thus, when assembled, housing 40 and conductive plate 50 are held securely together without play or movement by at least one coaxial probe connector 28.

As illustrated in FIG. 2, for ease of assembly of housing 40, conductive plate 50 and coaxial probe connectors 28, an alignment post 130 is provided on recessed face 48 of housing 40. Alignment post 130 engages a mating hole 132 in conductive plate 50, such that conductive plate 50 is lightly retained on housing 40 and bores 110, 114 are in close alignment during installation of coaxial probe connectors 28. An annular groove 134 is optionally provided in recessed face 48 around the base of alignment post 130 to accept any skived material from post 130 when conductive plate 50 slides over post 130. Although alignment post 130 may be located anywhere on recessed face 48 of housing 40, in one embodiment according to the invention, alignment post 130 is located adjacent one end of housing 40 (e.g., non-symmetrically). When so located, alignment post 130 may serve as a visual key for identifying probe positions in assembly 20, so that an assembler can quickly determine which bores should receive which probes.

Referring again to FIG. 3, bores 112 which receive a ground probe 26 in conductive plate 50 are aligned with respective bores 116 in housing 40. Bores 116 extend from recessed face 48 toward back side 44 of housing 40. In one embodiment according to the invention, bores 116 include a ramped side wall 140. Ramped side wall 140 progressively interferes with the ground probe 26 during its insertion into housing 40, such that the interference between the ground probe 26 and the ramped side wall 140 elastically deforms ground probe 26. The interference between ground probe 26 and ramped side wall 140 maintains a normal force between ground probe 26 and housing 40, such that ground probe 26 is retained in its desired position. In this manner, no probe receptacle is required, and the tolerance of that element is removed from the tolerance stack and the pointing accuracy of the device is improved.

Beneficially, the normal force generated by the deflected ground probes 26 may be directed such that the normal force urges conductive plate 50 against housing 40, so as to reduce or eliminate any space between forward face 46 of housing 40 and front surface 52 of conductive plate 50. In this manner, a zero clearance fit may be obtained along the lateral axis of the assembly 20, which improves the spring probe pointing accuracy of the device.

In an alternate embodiment according to the invention, bores 114 and 116 may be combined into a single cavity, to the extent that a deflected ground probe 26 may make contact with conductive shield tube 34 of coaxial probe connector 28.

In yet another embodiment according to the invention, ground probe 26 may be manufactured with what is referred to as a "banana bend", and bore 116 need not include a ramped side wall. The banana bend allows the ground spring probe 26 to be inserted into an oversized bore 116 and retained within the bore 116 by a frictional fit. Similar to the straight ground probe deflected by a ramped side wall 140, the normal force generated by a slightly deflected "banana bend" ground probe may be directed such that the normal force urges conductive plate 50 against housing 40, so as to reduce or eliminate any space between forward face 46 of housing 40 and front surface 52 of conductive plate 50.

Figure 6:
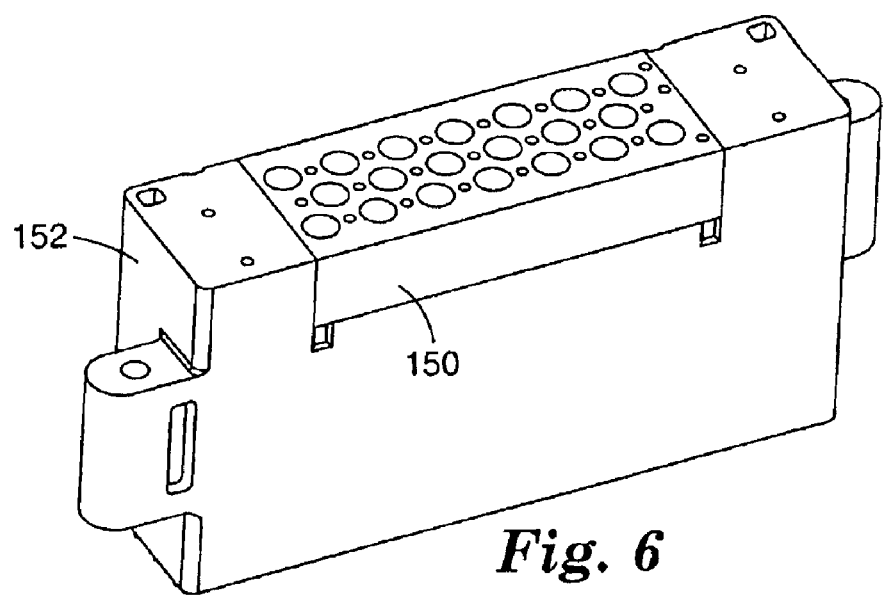
FIG. 6 is a perspective view of another embodiment of a spring probe block assembly according to the invention.
Figure 7:
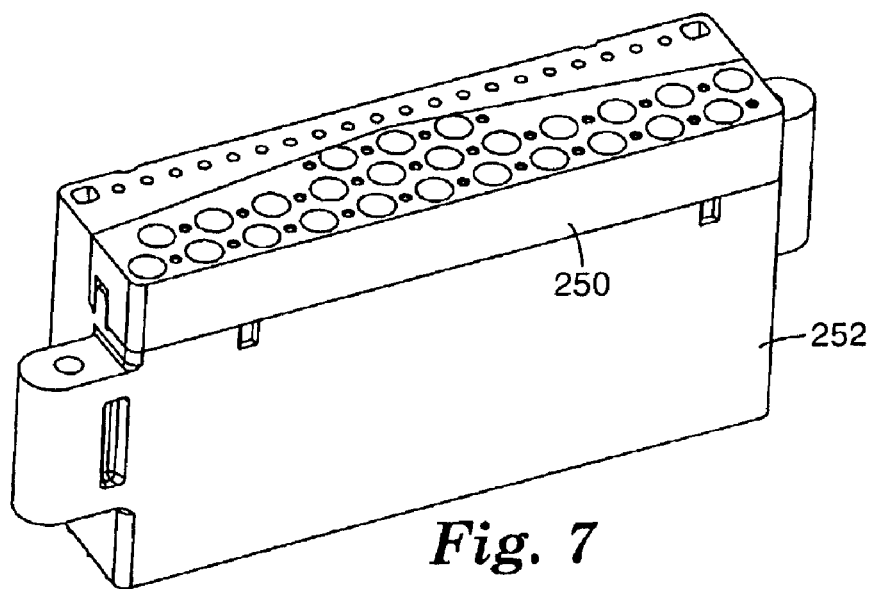
FIG. 7 is a perspective view of another alternate embodiment of a spring probe block assembly according to the invention.
Figure 8:
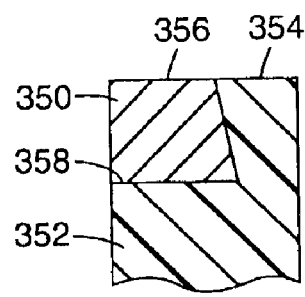
FIG. 8 is a cross-sectional view of another embodiment of a spring probe block assembly according to the invention.

In other embodiments according to the invention, the shape and location of conductive plate 50 may be varied from that shown in FIGS. 1–5. For example, as shown in FIG. 6, conductive plate 150 may be positioned between lateral edges of housing 152, such that insulative portions of housing 152 are on more than one side of conductive plate 150. In another example, as shown in FIG. 7, conductive plate 250 may be asymmetrically shaped and mated to housing 252 such that conductive plate 250 tends to correctly position itself on housing 252 without the aid of an alignment post 130 as described above. In yet another example, as shown in FIG. 8, conductive plate 350 may be shaped and mated to housing 352 such that the normal force generated by the elastically deflected ground probes 26 tends to urge conductive plate 350 and housing 352 together so as to reduce or eliminate any space between forward face 354 of housing 352 and front surface 356 of conductive plate 350, and also to urge conductive plate 350 toward recessed face 358 of housing 352.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the mechanical, electromechanical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A probe block assembly comprising:
   an electrically insulative housing having a front side, the front side including a forward face and a recessed face;
   an electrically conductive plate positioned against the recessed face of the front side of the housing;
   a plurality of probes in electrical isolation from each other extending from the forward face of the housing; and
   a plurality of probes in electrical contact with each other extending from a front surface of the conductive plate,
   wherein at least one probe is removably retained in a receptacle that is held in place by a retainer.

2. The assembly of claim 1, wherein, the front surface of the conductive plate is coplanar with the forward face of the housing.

3. The assembly of claim 1, wherein the plurality of probes extending from the forward face of the housing comprise power or utility probes.

4. The assembly of claim 1, wherein the plurality of probes extending from the conductive plate comprise signal probes and ground probes.

5. The assembly of claim 4, wherein the signal probes and ground probes extending from the front surface of the conductive plate extend through a back surface of the conductive plate and into the insulative housing.

6. The assembly of claim 5, wherein at least one of the plurality of probes extending into the housing is elastically deflected by the housing to create a normal force between the conductive plate and the housing.

7. The assembly of claim 6, wherein the ground probes are elastically deflected by the housing to create a normal force between the conductive plate and the housing.

8. The assembly of claim 6, wherein the housing further comprises a ramped side wall to elastically deflect at least one of the plurality of probes extending into the housing.

9. The assembly of claim 5, wherein the signal probes are contained in coaxial connectors that extend through the insulative housing to a back side of the housing.

10. The assembly of claim 4, wherein each of the plurality of signal probes is surrounded by an insulative layer and a conductive shell.

11. The assembly of claim 10, wherein the ground probes are electrically connected with the conductive shells surrounding the signal probes.

12. The assembly of claim 10, wherein the conductive plate receives the signal probes by press fit.

13. The assembly of claim 4, wherein the ground probe comprises a spring probe.

14. The assembly of claim 13, wherein the conductive plate receives the ground probes by slip fit.

15. The assembly of claim 1, wherein each of the plurality of probes extending from the forward face of the housing are removably secured in the housing by a corresponding probe receptacle.

16. The assembly of claim 15, wherein each of the probe receptacles are removably secured in the housing by the retainer.

17. The assembly of claim 16, wherein the retainer is removably secured in a recess near a back side of the housing.

18. The assembly of claim 17, wherein the retainer is force-fit in the recess.

19. The assembly of claim 17, wherein the retainer is snap-fit in the recess.

20. The assembly of claim 16, wherein the retainer includes a plurality of shoulders for engaging each of the plurality of probe receptacles.

21. The assembly of claim 20, wherein the retainer includes an alignment key which mates with an alignment groove in the housing to properly position shoulders of the retainer relative to the plurality of probe receptacles.

22. The assembly of claim 1, wherein each of the plurality of probes extending from the forward face of the housing are removably secured in the housing by the retainer.

23. The assembly of claim 22, wherein the retainer is removably secured in a recess near a back side of the housing.

24. The assembly of claim 1, further comprising mounting tabs projecting from the housing.

25. The assembly of claim 1, wherein the conductive plate is formed of a metal.

26. The assembly of claim 1, wherein the conductive plate is formed of a conductive polymer.

27. The assembly of claim 1, wherein the conductive plate is formed of a metal plated polymer.

28. The assembly of claim 1, wherein the insulative housing receives the probes by slip fit.

29. The assembly of claim 1, further comprising a cover for releasably engaging the housing and covering the probes extending from the housing and the conductive plate.

30. A probe block assembly comprising:
an insulative housing;
an interface end on the housing including an insulative portion and a conductive portion;
a plurality of probes retained in the insulative portion in electrical isolation from each another;
a plurality of probes retained in the conductive portion in electrical contact with each other,
wherein at least one probe is removably retained in a receptacle that is held in place by a retainer.

31. The assembly of claim 30, wherein the plurality of probes retained in the insulative portion comprise utility probes.

32. The assembly of claim 30, wherein the plurality of probes retained in the conductive portion comprise signal probes and ground probes.

33. The assembly of claim 30, wherein the conductive portion and the insulative portion of the interface end are coplanar.

34. The assembly of claim 30, wherein the housing is formed of an insulative material, and the conductive portion is inset into the interface end.

35. The assembly of claim 30, wherein at least one of the plurality of probes retained in the conductive portion extends to a back side of the housing and includes a flange engaging the back side of the housing.

36. The assembly of claim 35, wherein the flange engages protrusions on the back side of the housing, the protrusions deforming to accommodate variations in the dimensions of the conductive portion, the housing, and the at least one probe.

37. A probe block assembly comprising:
an insulative housing having a recessed portion in a front face of the housing;
a conductive block having a plurality of passages therethrough, the conductive block positioned within the recessed portion in the front face of the housing;
a plurality of signal probes and ground probes extending through the passages of the conductive block; and
a plurality of utility probes spaced from the conductive block and extending though the housing,
wherein at least one probe is removably retained in a receptacle that is held in place by a retainer.

38. The probe block assembly of claim 37, wherein each of the signal probes is surrounded by an insulative material and a conductive shell.

39. The probe block assembly of claim 38, wherein the ground probes are in electrical contact with the conductive shells of the signal probes.

40. The probe block assembly of claim 39, wherein the utility probes are electrically isolated from the signal probes and the ground probes.

41. The probe block assembly of claim 37, wherein the conductive block is aligned with the housing by a post extending from the recessed portion in the front face of the housing.

42. The probe block assembly of claim 41, wherein the post engages a mating hole in the conductive block.

43. The probe block assembly of claim 42, further comprising an annular groove in the recessed portion surrounding the post.

44. The probe block assembly of claim 41, wherein the post is asymmetrically positioned on the recessed portion in the front face of the housing.

* * * * *